United States Patent
Kim et al.

(10) Patent No.: US 10,747,198 B2
(45) Date of Patent: Aug. 18, 2020

(54) SOLDER INSPECTION APPARATUS AND METHOD OF GENERATING FEEDBACK INFORMATION OF SOLDER INSPECTION APPARATUS

(71) Applicant: KOH YOUNG TECHNOLOGY INC., Seoul (KR)

(72) Inventors: Jeong Yeob Kim, Seoul (KR); Sa Woong Kim, Gwangmyeong-si (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 660 days.

(21) Appl. No.: 15/504,880

(22) PCT Filed: Aug. 17, 2015

(86) PCT No.: PCT/KR2015/008561
§ 371 (c)(1),
(2) Date: Feb. 17, 2017

(87) PCT Pub. No.: WO2016/028040
PCT Pub. Date: Feb. 25, 2016

(65) Prior Publication Data
US 2017/0277165 A1    Sep. 28, 2017

(30) Foreign Application Priority Data
Aug. 18, 2014 (KR) ......................... 10-2014-0106837

(51) Int. Cl.
*G05B 19/4065* (2006.01)
*B41F 15/08* (2006.01)
(Continued)

(52) U.S. Cl.
CPC ...... *G05B 19/4065* (2013.01); *B41F 15/0881* (2013.01); *B41F 15/12* (2013.01);
(Continued)

(58) Field of Classification Search
None
See application file for complete search history.

(56) References Cited

U.S. PATENT DOCUMENTS

| 5,555,316 A | 9/1996 | Tsujikawa et al. |
| 5,991,435 A | 11/1999 | Tsujikawa et al. |

(Continued)

FOREIGN PATENT DOCUMENTS

| CN | 102001240 | 4/2011 |
| CN | 102348334 | 2/2012 |

(Continued)

OTHER PUBLICATIONS

International Search Report for International Application No. PCT/KR2015/008561 with English translations, dated Nov. 26, 2015.

*Primary Examiner* — Gregory J Toatley, Jr.
*Assistant Examiner* — Terence E Stifter, Jr.
(74) *Attorney, Agent, or Firm* — Kile Park Reed & Houtteman PLLC (57) ABSTRACT

A feedback information generation method for a solder inspection apparatus includes: receiving an input of information on the number of buffers which are disposed between the solder inspection apparatus and a screen printer for printing solder on printed circuit boards and are configured to support the printed circuit boards to be introduced into the solder inspection apparatus so as to put the printed circuit boards on standby; generating feedback information by using the input information and an inspection result of the printed circuit boards by the solder inspection apparatus; and transmitting the feedback information to the screen printer. Feedback information may be generated in consideration of the number of buffers, thereby preventing the feedback information from being excessively generated as well as ensuring the accuracy of the feedback information.

20 Claims, 5 Drawing Sheets

(51) Int. Cl.
  *B41F 33/00* (2006.01)
  *B41F 15/26* (2006.01)
  *H05K 3/12* (2006.01)
  *B41F 15/12* (2006.01)
  *H05K 3/34* (2006.01)

(52) U.S. Cl.
  CPC .......... *B41F 15/26* (2013.01); *B41F 33/0036* (2013.01); *B41F 33/0081* (2013.01); *H05K 3/1216* (2013.01); *H05K 3/1233* (2013.01); *B41P 2215/112* (2013.01); *G05B 2219/32204* (2013.01); *G05B 2219/45026* (2013.01); *H05K 3/3484* (2013.01); *H05K 2203/163* (2013.01)

(56) References Cited

U.S. PATENT DOCUMENTS

| | | |
|---|---|---|
| 6,167,149 A | 12/2000 | Tsujikawa et al. |
| 2004/0244613 A1* | 12/2004 | Barajas ................ H05K 3/1233 101/130 |
| 2009/0314201 A1 | 12/2009 | Baccini |
| 2012/0031952 A1 | 2/2012 | Hattori et al. |
| 2012/0327215 A1* | 12/2012 | Case .................. G01N 21/8806 348/92 |
| 2015/0210064 A1 | 7/2015 | Kim et al. |

FOREIGN PATENT DOCUMENTS

| | | |
|---|---|---|
| JP | 06-027032 | 2/1994 |
| JP | 2005-207848 | 8/2005 |
| KR | 10-2001-0027593 | 4/2001 |
| KR | 10-0914738 | 8/2009 |
| KR | 10-2013-0019098 | 2/2013 |
| KR | 10-2013-0121747 | 11/2013 |
| WO | 2012/164233 | 12/2012 |

* cited by examiner

SOLDER INSPECTION APPARATUS AND METHOD OF GENERATING FEEDBACK INFORMATION OF SOLDER INSPECTION APPARATUS

TECHNICAL FIELD

The present disclosure relates to a solder inspection apparatus and a method of generating feedback information of the solder inspection apparatus. More particularly, the present disclosure relates to the method of generating the feedback information to be transmitted to a screen printer, based on information on the number of buffers from an inspection result of printed circuit boards, and the solder inspection apparatus for performing the method, the buffers being disposed between the solder inspection apparatus and the screen printer for printing solder and being configured to put the printed circuit boards on standby before the solder inspection apparatus.

BACKGROUND ART

In general, the process of mounting electronic components on a printed circuit board proceeds in the order of: applying solder onto the pad of a printed circuit board through screen printer equipment; inspecting the solder application state through solder paste inspection (SPI) equipment; and mounting the electronic components through component mounting equipment by using a surface mount technology (SMT).

Here, the screen printer applies the solder onto a pad of the printed circuit board by applying a solder paste in a state that a stencil mask having an opening is arranged on the printed circuit board, wherein the opening is formed in an area corresponding to a position of the pad formed on the printed circuit board.

When printing the solder paste through the screen printer as described above, there is a problem in which an error occurs in the position of the solder that is actually printed because of an alignment error of the stencil mask, a mismatch between the fiducial mark camera coordinate system inside the screen printer and the printed circuit board or the mask correction coordinate system, or the like.

In addition, there is another problem in which the amount of solder printed on the pad position of the printed circuit board is less or more than a reference value, or the like, due to a defect of the stencil mask.

Thus, in order to solve the problems, the screen printer and the solder inspection apparatus are configured to communicate with each other, and the solder inspection apparatus can generate feedback information and transmit the feedback information to the screen printer, wherein the feedback information includes a correction value for correcting the position of solder when the screen printer prints the solder, a check signal for checking the stencil mask of the screen printer, or the like.

However, in a case where a buffer configured to put the printed circuit board to be introduced into the solder inspection apparatus on standby is disposed between the screen printer and the solder inspection apparatus, and the feedback information is generated without considering the buffer, an excessive correction may occur in the screen printer or a check signal requesting the checking of the screen printer may occur too frequently.

Therefore, in the case where one or more buffers are disposed between the screen printer and the solder inspection apparatus and configured to put the printed circuit boards on standby, a method is required to improve the reliability of the feedback information that is generated by the solder inspection apparatus in consideration of the buffers.

SUMMARY

The present disclosure provides a method of generating feedback information generation of a solder inspection apparatus in consideration of the number of buffers in the case where one or more buffers are disposed between the screen printer and the solder inspection apparatus and configured to put the printed circuit boards on standby, and further provides a solder inspection apparatus for performing the method.

The technical problems of the present disclosure are not limited to that mentioned above, and those skilled in the art will clearly understand other technical problems that have not been mentioned from the following description.

A method of generating feedback information of a solder inspection apparatus, according to an aspect of the present disclosure, may include: receiving, by a user interface unit of the solder inspection apparatus, an input of information on the number of buffers that are disposed between a screen printer configured to print solder on printed circuit boards and the solder inspection apparatus, the buffers being configured to support the printed circuit boards that are to be introduced into the solder inspection apparatus so as to be on standby; generating, by a feedback information generation unit of the solder inspection apparatus, feedback information by using the input information on the number of buffers and an inspection result of the printed circuit boards by means of the solder inspection apparatus; and transmitting, by a transmission unit of the solder inspection apparatus, the generated feedback information to the screen printer.

Generating the feedback information may include: calculating, by the feedback information generation unit, a correction ratio that is an application ratio of a correction value to correct a position of the solder when the screen printer prints the solder on the printed circuit boards, according to the number of buffers; and generating the feedback information by using the correction ratio and the correction value that is generated through the inspection of the printed circuit boards by means of the solder inspection apparatus.

The feedback information may be generated by the product of the correction value for each of printed circuit boards and the correction ratio, the correction value being measured by the solder inspection apparatus.

The correction value may be generated based on position information of a pad and position information of the solder on the printed circuit boards.

Calculating the correction ratio may include setting the correction ratio to 50% when the number of buffers is three or less.

Calculating the correction ratio may include calculating the correction ratio using the following equation when the number of buffers is four or more and is even, Correction ratio=100/(number of buffers/2), and  (Equation)

calculating the correction ratio may include calculating the correction ratio using the following equation when the number of buffers is four or more and is odd, Correction ratio=100/((number of buffers+1)/2).  (Equation)

Generating the feedback information may include generating a check signal for checking the screen printer as the feedback information.

Generating the check signal as the feedback information may include generating the check signal by comparing, with a predetermined reference value, at least one of the number of under-soldering defects of the solder, the number of over-soldering defects of the solder, the number of bridge defects, or the total number thereof with respect to the printed circuit boards inspected by the solder inspection apparatus.

Generating the check signal as the feedback information may include not generating the check signal for printed circuit boards that are introduced into the solder inspection apparatus as many times as the number of buffers.

A solder inspection apparatus, according to another aspect of the present disclosure, may include: a user interface unit configured to receive an input of information on the number of buffers configured to support printed circuit boards transferred from a screen printer; a feedback information generation unit configured to generate feedback information by using the input information on the number of buffers and an inspection result of the printed circuit boards; and a transmission unit configured to transmit the generated feedback information to the screen printer.

The feedback information generation unit may be configured to: calculate a correction ratio that is an application ratio of a correction value to correct a position of the solder when the screen printer prints the solder on the printed circuit boards, according to the number of buffers; and generate the feedback information by using the correction ratio and the correction value that is generated through the inspection of the printed circuit boards.

The feedback information generation unit may be configured to generate the feedback information by the product of the correction value for each of the printed circuit boards and the correction ratio, the correction value being measured by the solder inspection apparatus.

The feedback information generation unit may be configured to generate the correction value, based on position information of a pad and position information of the solder on the printed circuit boards.

The feedback information generation unit may be configured to set the correction ratio to 50% when the number of buffers is three or less.

The feedback information generation unit may be configured to calculate the correction ratio using the following equation when the number of buffers is four or more and is even, Correction ratio=100/(number of buffers/2), and     (Equation)

the feedback information generation unit may be configured to calculate the correction ratio using the following equation when the number of buffers is four or more and is odd, Correction ratio=100/((number of buffers+1)/2).     (Equation)

The feedback information generation unit may be configured to generate a check signal for checking the screen printer as the feedback information.

The feedback information generation unit may be configured to generate the check signal by comparing, with a predetermined reference value, at least one of the number of under-soldering defects of the solder, the number of over-soldering defects of the solder, the number of bridge defects, or the total number thereof with respect to the printed circuit boards inspected by the solder inspection apparatus.

The feedback information generation unit may be configured to not generate the check signal for printed circuit boards that are introduced through the buffers as many times as the number of buffers.

According to the method of the feedback information of the solder inspection apparatus, according to an embodiment of the present disclosure, it is possible to prevent an over-correction from occurring when correcting the position of solder in the screen printer and to then improve the reliability of the solder printing in the screen printer by generating the feedback information in consideration of the number of buffers which are disposed between the solder inspection apparatus and the screen printer.

Meanwhile, when the feedback information, such as the check signal, is generated through the board inspection by the solder inspection apparatus, the generation of the feedback information is skipped with respect to the printed circuit boards corresponding to the number of buffers after the same in order to thereby prevent the excessive occurrence of the check signal and in order to thereby enhance the operational efficiency.

The effects of the present disclosure are not limited to the effects mentioned above, and those skilled in the art will clearly understand other effects that have not been mentioned above from the claims.

DETAILED DESCRIPTION

The objective and effects of some embodiments of the present disclosure, and the technical configuration to accomplish the same, will be apparent with reference to the embodiments which will be described later in detail in conjunction with the accompanying drawings. If it is determined that the detailed description of prior functions or configurations unnecessarily obscures the subject matter of the present disclosure in the following description of the embodiments, the detailed description will be omitted. In addition, the terms that will be described later are defined in consideration of the structure, role, and functions of some embodiments, and may vary according to the intention of a user or operator, or custom.

However, the present disclosure is not limited to the embodiments set forth hereinafter, and may be implemented in various and different forms. The present embodiments are merely provided to complete the disclosure and to inform those skilled in the art of the scope of the disclosure, and the present disclosure shall be defined by the statement in the claims. Therefore, the definition thereof should be made based on the details throughout the present specification.

In the present specification, the expression 'a certain part "includes" a certain element' is intended to further include other elements and is not intended to exclude other elements unless stated otherwise.

Hereinafter, preferred embodiments of the present disclosure will be described in more detail with reference to the accompanying drawings.

Figure 1:
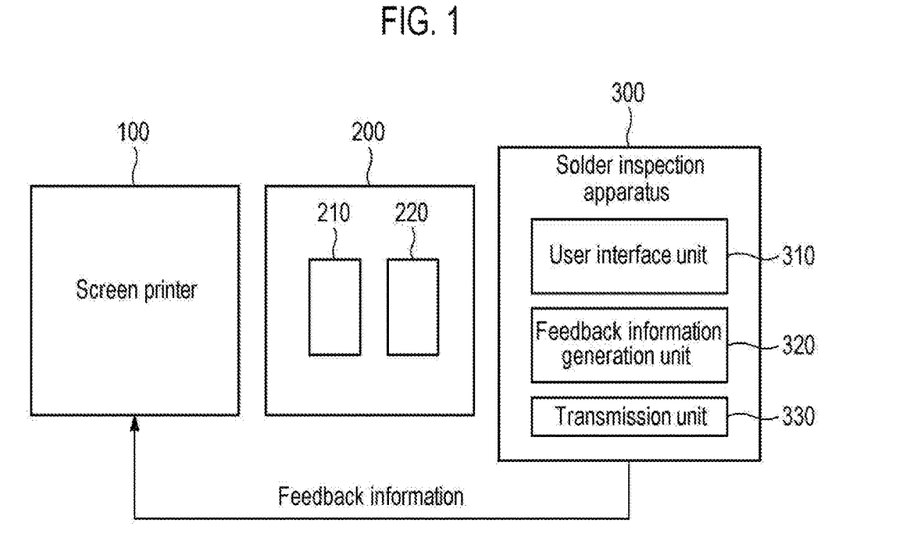
FIG. 1 is an overall system diagram for explaining a method of generating feedback information of a solder inspection apparatus, according to an embodiment of the present disclosure.
Figure 2:
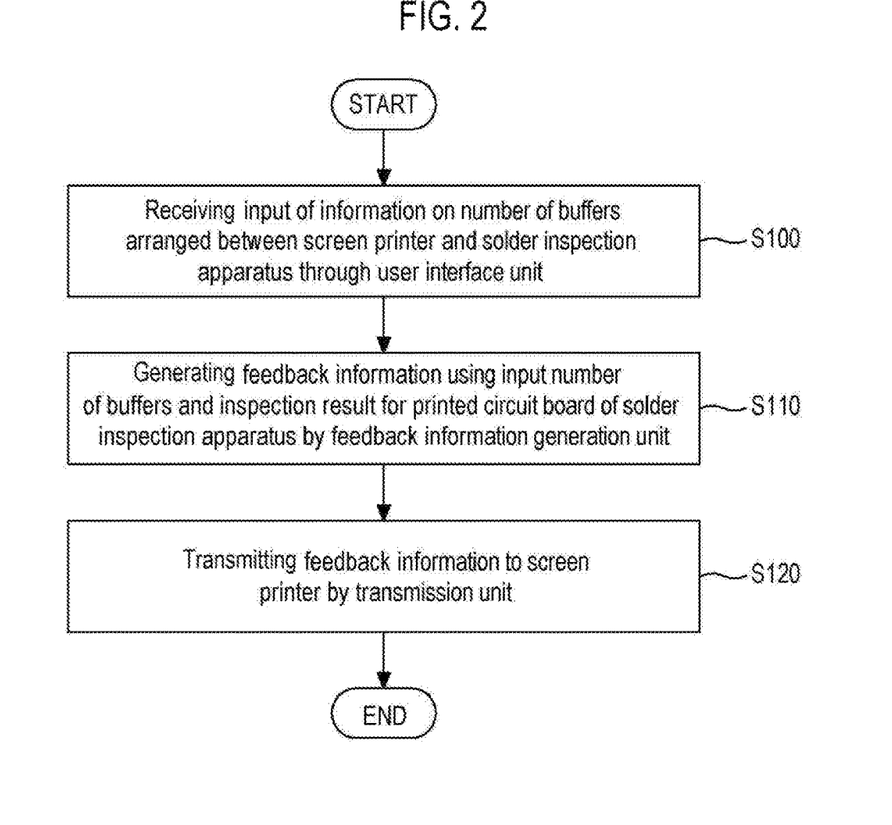
FIG. 2 shows a first flowchart of the method of generating the feedback information of the solder inspection apparatus, according to an embodiment of the present disclosure.

FIG. 1 is an overall system diagram for explaining a method of generating feedback information of a solder inspection apparatus, according to an embodiment of the present disclosure, and FIG. 2 shows a first flowchart of the method of generating the feedback information of the solder inspection apparatus, according to an embodiment of the present disclosure.

Referring to FIG. 1, the system includes: a screen printer 100 configured to print solder on a printed circuit board; a solder inspection apparatus 300 configured to inspect the printed circuit board; and a board support 200 which is arranged between the screen printer 100 and the solder inspection apparatus 300, the board support 200 being configured to support a printed circuit board on which the solder is printed and to put the printed circuit board on standby, before the printed circuit board is introduced into the solder inspection apparatus 300.

At this time, the screen printer 100 and the solder inspection apparatus 300 may be configured to be connected with each other by wired or wireless communication to then enable the data transmission and reception. In addition, the screen printer 100, the board support 200, and the solder inspection apparatus 300 may be connected with each other by wired or wireless communication to then enable the data transmission and reception.

Further, the board support 200 includes at least one buffer configured to support the printed circuit board, which is to be introduced into the solder inspection apparatus 300, and to put the printed circuit board on standby. The present embodiment will be described on the assumption that there are two buffers 210 and 220. The number of buffers may vary according to systems.

Furthermore, the solder inspection apparatus 300 includes: a user interface unit 310 configured to receive instructions from a user; a feedback information generation unit 320 configured to generate feedback information to be transmitted to the screen printer 100; and a transmission unit 330 configured to transmit the feedback information, and the solder inspection apparatus 300 may include additional elements configured to inspect the printed circuit board, however, the additional elements will be omitted for the convenience of explanation.

First, the user interface unit 310 of the solder inspection apparatus 300 receives input information on the number of buffers, which are included in the board support 200 (S100). The user interface unit 310 may adopt various types of interfaces, such as a mouse, a keyboard, a keypad, or a touch panel.

When the user interface unit 310 is connected to the buffers 210 and 220 by wired or wireless communication, the user interface unit 310 may recognize the number of buffers based on information received from the buffers 210 and 220.

Then, the feedback information generation unit 320 generates feedback information by using the inputted number of buffers and an inspection result of the printed circuit board by means of the solder inspection apparatus 300 (S110).

At this time, the feedback information generation unit 320 automatically calculates a correction ratio, which is an application ratio of a correction value when the screen printer 100 prints solder on the printed circuit board, based on the inputted number of buffers. Further, the feedback information generation unit 320 generates the feedback information by using the correction ratio and a correction value, which is generated through the inspection of the printed circuit board in the solder inspection apparatus 300. The correction value may be generated based on position information of a pad and position information of solder in the printed circuit board.

At this time, the solder inspection apparatus 300 inspects the introduced printed circuit board to generate the correction value when the screen printer 100 prints the solder, and the correction ratio refers to a ratio for adjusting the generated correction value.

Figure 3:
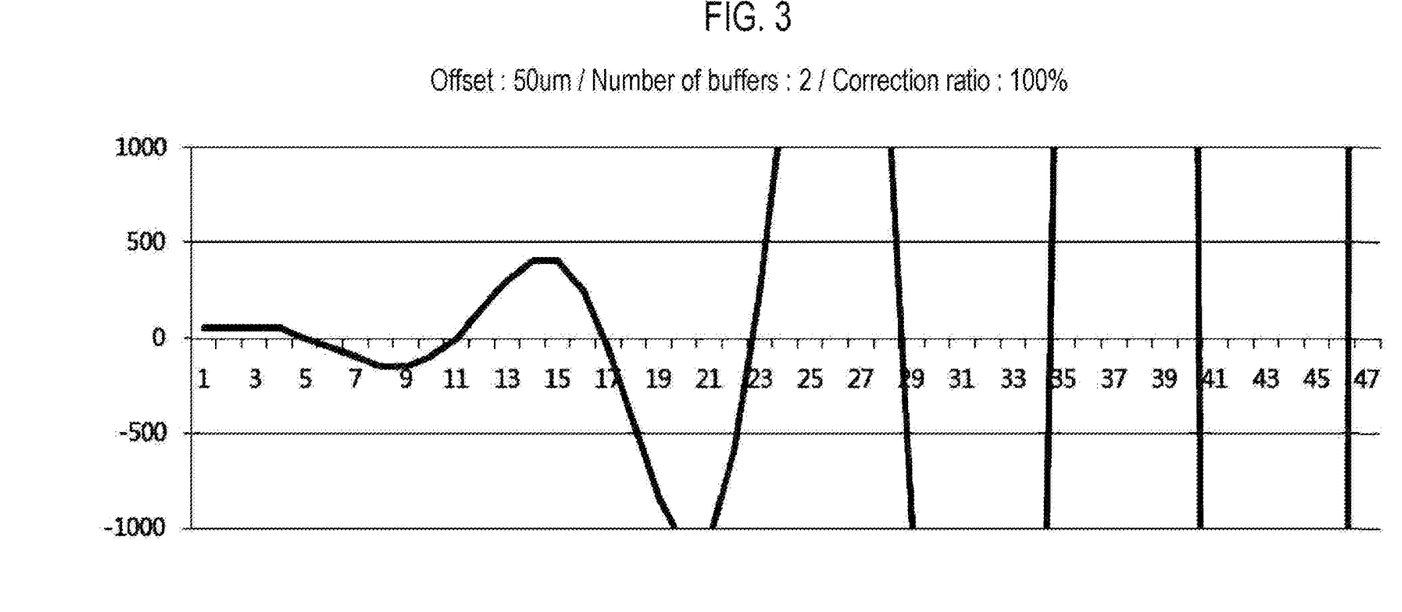
FIG. 3 is a diagram illustrating a change of the correction values when the method of generating the feedback information of the solder inspection apparatus, according to an embodiment of the present disclosure, is not applied.

FIG. 3 is a diagram illustrating a change of the correction values when the method of generating the feedback information of the solder inspection apparatus, according to an embodiment of the present disclosure, is not applied. In FIG. 3, the X-axis represents the number of the printed circuit boards, and the Y-axis represents the correction values.

FIG. 3 shows the case in which 100% of the correction value calculated by the solder inspection apparatus 300 is applied when the number of buffers is two and an offset is 50 μm, and it can be seen that the correction value does not converge but diverges.

This corresponds to the case where the screen printer 100 already completes the additionally printing of the solder on the printed circuit boards as many times as the number of buffers when the solder inspection apparatus 300 transmits a result of the first printed circuit board as feedback information. Therefore, an overcorrection occurs by 200% due to two printed circuit boards, which already exist on the buffers, so that the correction value diverges as shown in FIG. 3. As a result, the reliability of the feedback information including the correction value, which is transmitted to the screen printer 100, is lowered.

Therefore, it is preferable to calculate a correction ratio depending on the number of buffers and to generate the feedback information by means of the product of a correction value and the calculated correction ratio based on the same.

The correction ratio may be variously set depending on the number of buffers.

For example, the correction ratio may be set to 50% if the number of buffers is three or less.

In addition, the correction ratio may be set according to the following equations if the number of buffers is four or more.

The correction ratio may be set as shown in the following Equation 1 if the number of buffers is even, and the correction ratio may be set as shown in the following Equation 2 if the number of buffers is odd.

$$\text{Correction ratio} = 100/(\text{number of buffers}/2) \quad \text{(Equation 1)}$$

$$\text{Correction ratio} = 100/((\text{number of buffers}+1)/2) \quad \text{(Equation 2)}$$

The method of determining the correction ratio is only an example, and may not be limited thereto, and various methods for determining the correction ratio may be applied in consideration of the number of buffers.

Figure 4:
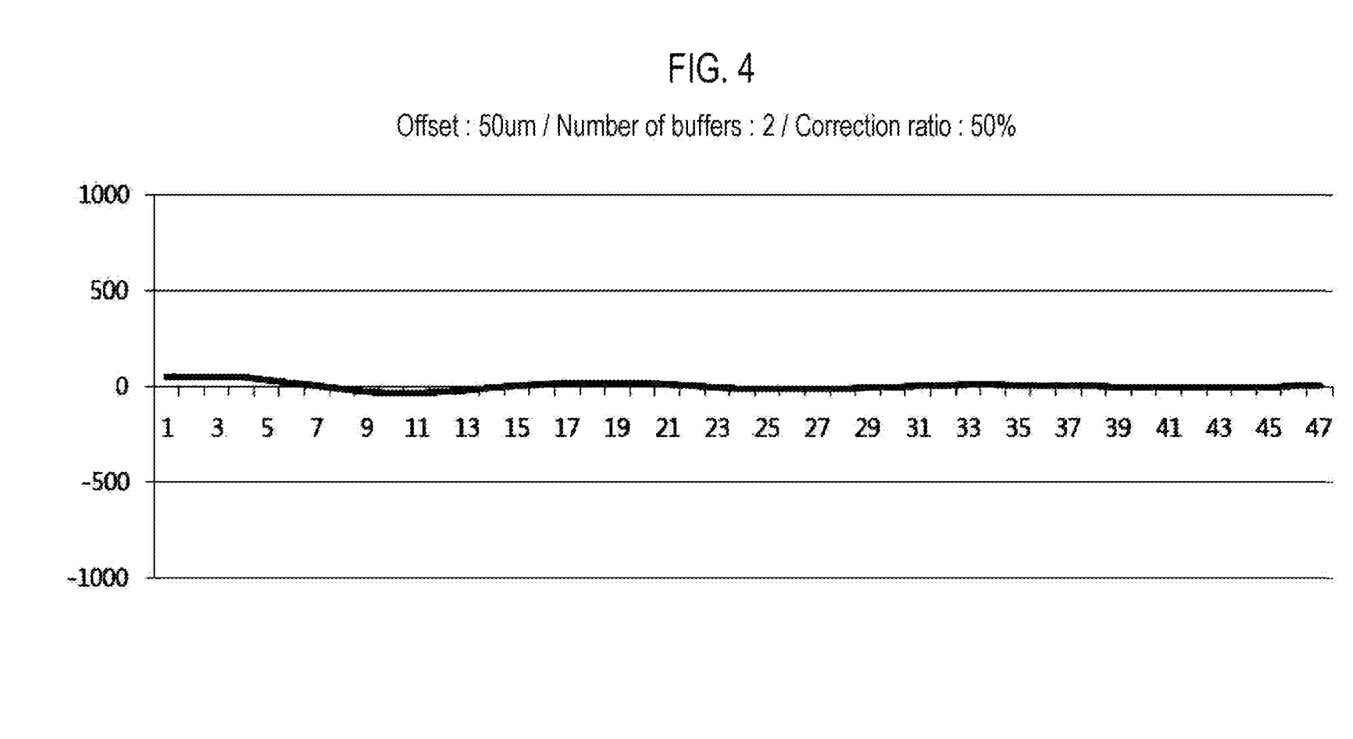
FIG. 4 is a diagram illustrating a change of the correction values when the method of generating the feedback information of the solder inspection apparatus, according to an embodiment of the present disclosure, is applied.

FIG. 4 is a diagram illustrating a change of the correction values when the method of generating the feedback information of the solder inspection apparatus, according to an embodiment of the present disclosure, is applied. FIG. 4 shows the case in which the correction ratio is adjusted to 50% under the same condition as FIG. 3, and it can be seen that the correction values converge as a result of applying a correction ratio of 50% when the number of buffers is three or less. It can be seen that it is possible to prevent the correction values from diverging due to the overcorrection shown in FIG. 3 by applying the method of generating the feedback information of the solder inspection apparatus, according to the embodiment of the present disclosure.

Meanwhile, the transmission unit 330 transmits the feedback information, which is generated by applying the correction ratio and the correction value, to the screen printer 100 (S120). The screen printer 100 may perform a solder printing process on the printed circuit board by reflecting the received feedback information.

Figure 5:
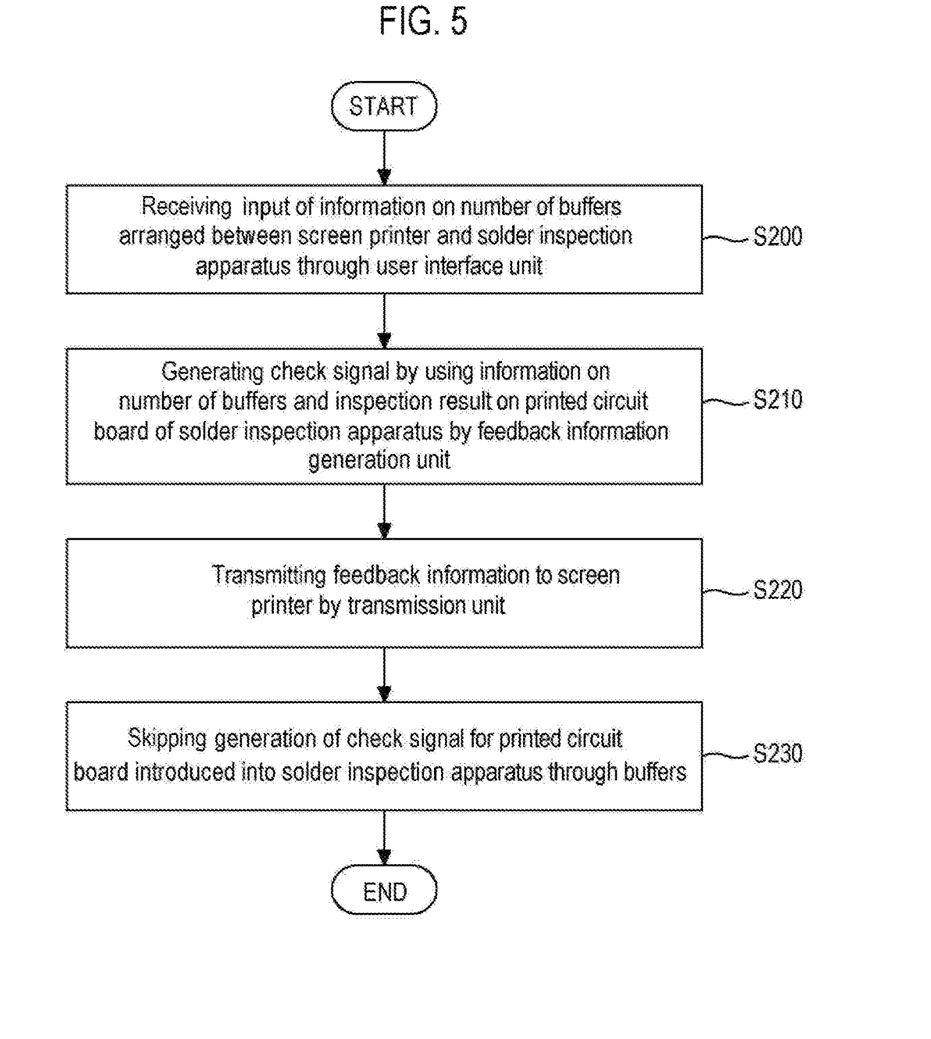
FIG. 5 shows a second flowchart of the feedback information generation method of a solder inspection apparatus, according to an embodiment of the present disclosure.

Meanwhile, the feedback information may be a check signal for checking the screen printer 100. FIG. 5 shows a second flowchart of the method of generating the feedback information of the solder inspection apparatus, according to an embodiment of the present disclosure.

Referring to FIG. 5, first, the user interface unit 310 receives an input of information on the number of buffers included in the board support 200, which is disposed between the screen printer 100 and the solder inspection apparatus 300 (S200).

Then, the feedback information generation unit 320 generates the check signal for requesting the check of the screen printer 100 by using the input information on the number of buffers and an inspection result of the printed circuit board by means of the solder inspection apparatus 300 (S210).

The check signal may be generated when at least one of the number of under-soldering defects of the solder, the number of over-soldering defects of the solder, the number of bridge defects, or the total number thereof with respect to the printed circuit boards inspected by the solder inspection apparatus 300 exceeds a predetermined reference value.

The transmission unit 330 transmits the feedback information (that is, the check signal), which is generated by the feedback information generation unit 320, to the screen printer 100 (S220).

When the screen printer 100 receives and outputs the check signal, a manager may proceed with a check process that is necessary for the screen printer 100, such as cleaning of a stencil mask. When the check signal is generated, the generation of a check signal is skipped for printed circuit boards that are introduced into the solder inspection apparatus 300 through the buffers after the generation of the check signal (S230). The number of skipped boards corresponds to the number of buffers.

For example, if the number of buffers is two, the screen printer 100 already completes the printing on the printed circuit boards as many times as the number of buffers when the solder inspection apparatus 300 transmits the feedback information on a first printed circuit board to the screen printer 100. As a result, the same check signal may be repeatedly generated as many times as the number of the buffers after the generation of the first check signal due to the printed circuit boards that have already been printed and remain on the buffers. Therefore, it is possible to control the excessive generation of the check signal by skipping the generation of the check signal with respect to the printed circuit boards as many times as the number of the buffers after the generation of the first check signal.

As described above, it is possible to prevent the screen printer 100 from excessively outputting the check signal and to further improve the work efficiency in the screen printer 100, by controlling the generation of the check signal in consideration of the number of buffers.

Although the description has been made with reference to the preferred embodiments of the present disclosure in the detailed description above, those skilled in the art or those of ordinary knowledge in the art shall understand that the present disclosure may have various changes and modifications without departing from the spirit and scope of the present disclosure, which are set forth in the claims below.

What is claimed is:

1. A method of generating feedback information of a solder inspection apparatus, the method comprising:
receiving, by a user interface unit of the solder inspection apparatus, input information indicating a number of buffers, the buffers being disposed between a screen printer configured to print solder on printed circuit boards and the solder inspection apparatus, and being configured to support the printed circuit boards that are to be introduced into the solder inspection apparatus so as to put the printed circuit boards on standby;
generating, by a feedback information generation unit of the solder inspection apparatus, feedback information according to the number of the buffers between the screen printer and the solder inspection apparatus indicated by the input information and an inspection result of the printed circuit boards by means of the solder inspection apparatus; and
transmitting, by a transmission unit of the solder inspection apparatus, the generated feedback information to the screen printer.

2. The method according to claim 1, wherein generating the feedback information comprises:
calculating, by the feedback information generation unit, a correction ratio that is an application ratio of a correction value to correct a position of the solder when the screen printer prints the solder on the printed circuit boards, according to the number of buffers; and
generating the feedback information by using the correction ratio and the correction value that is generated through the inspection of the printed circuit boards by means of the solder inspection apparatus.

3. The method according to claim 2, wherein the feedback information is generated by the product of the correction value for each of the printed circuit boards and the correction ratio, the correction value being measured by the solder inspection apparatus.

4. The method according to claim 2, wherein the correction value is generated based on position information of a pad and position information of the solder on the printed circuit boards.

5. The method according to claim 2, wherein calculating the correction ratio comprises setting the correction ratio to 50% when the number of buffers is three or less.

6. The method according to claim 2, wherein calculating the correction ratio comprises calculating the correction ratio by means of the following equation when the number of buffers is four or more and is even, Correction ratio=100/(number of buffers/2).    (Equation)

7. The method according to claim 2, wherein calculating the correction ratio comprises calculating the correction ratio by means of the following equation when the number of buffers is four or more and is odd, Correction ratio=100/((number of buffers+1)/2).    (Equation)

8. The method according to claim 1, wherein generating the feedback information comprises generating a check signal for checking the screen printer as the feedback information.

9. The method according to claim 8, wherein generating the check signal as the feedback information comprises generating the check signal by comparing, with a predetermined reference value, at least one of the number of under-soldering defects of the solder, the number of over-soldering defects of the solder, the number of bridge defects, or the total number thereof with respect to the printed circuit boards inspected by the solder inspection apparatus.

10. The method according to claim 8, wherein generating the check signal as the feedback information comprises not generating the check signal for printed circuit boards that are introduced into the solder inspection apparatus as many times as the number of buffers.

11. A solder inspection apparatus comprising:
a user interface unit configured to receive input information indicating a number of buffers, the buffers being disposed between a screen printer configured to print solder on printed circuit boards and the solder inspection apparatus, and being configured to support the printed circuit boards that are to be introduced into the solder inspection apparatus so as to put the printed circuit boards on standby;
a feedback information generation unit configured to generate feedback information according to the number of the buffers between the screen printer and the solder inspection apparatus indicated by the input information and an inspection result of the printed circuit boards; and
a transmission unit configured to transmit the generated feedback information to the screen printer.

12. The apparatus according to claim 11, wherein the feedback information generation unit is configured to:
calculate a correction ratio that is an application ratio of a correction value to correct a position of the solder when the screen printer prints the solder on the printed circuit boards, according to the number of buffers; and
generate the feedback information by using the correction ratio and the correction value that is generated through the inspection of the printed circuit boards.

13. The apparatus according to claim 12, wherein the feedback information generation unit is configured to generate the feedback information by the product of the correction value for each of the printed circuit boards and the correction ratio, the correction value being measured by the solder inspection apparatus.

14. The apparatus according to claim 12, wherein the feedback information generation unit is configured to generate the correction value, based on position information of a pad and position information of the solder on the printed circuit boards.

15. The apparatus according to claim 12, wherein the feedback information generation unit is configured to set the correction ratio to 50% when the number of buffers is three or less.

16. The apparatus according to claim 12, wherein the feedback information generation unit is configured to calculate the correction ratio by means of the following equation when the number of buffers is four or more and is even, $$\text{Correction ratio}=100/(\text{number of buffers}/2). \quad \text{(Equation)}$$

17. The apparatus according to claim 12, wherein the feedback information generation unit is configured to calculate the correction ratio by means of the following equation when the number of buffers is four or more and is odd, $$\text{Correction ratio}=100/((\text{number of buffers}+1)/2). \quad \text{(Equation)}$$

18. The apparatus according to claim 11, wherein the feedback information generation unit is configured to generate a check signal for checking the screen printer as the feedback information.

19. The apparatus according to claim 18, wherein the feedback information generation unit is configured to generate the check signal by comparing, with a predetermined reference value, at least one of the number of under-soldering defects of the solder, the number of over-soldering defects of the solder, the number of bridge defects, or the total number thereof with respect to the printed circuit boards inspected by the solder inspection apparatus.

20. The apparatus according to claim 18, wherein the feedback information generation unit is configured to not generate the check signal for printed circuit boards that are introduced through the buffers as many times as the number of buffers.

* * * * *